(12) United States Patent
Yuan et al.

(10) Patent No.: US 11,289,675 B2
(45) Date of Patent: Mar. 29, 2022

(54) DISPLAY PANEL WITH SUPPORT STRUCTURE AND METHOD OF MANUFACTURING THE SAME

(71) Applicant: Yungu (Gu' an) Technology Co., Ltd., Langfang (CN)

(72) Inventors: Sha Yuan, Langfang (CN); Feng Yu, Langfang (CN); Yinghai Ma, Langfang (CN); Feng Zhang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 444 days.

(21) Appl. No.: 16/340,383

(22) PCT Filed: Nov. 26, 2018

(86) PCT No.: PCT/CN2018/117516
§ 371 (c)(1),
(2) Date: Apr. 9, 2019

(87) PCT Pub. No.: WO2019/218635
PCT Pub. Date: Nov. 21, 2019

(65) Prior Publication Data
US 2021/0343975 A1    Nov. 4, 2021

(30) Foreign Application Priority Data

May 14, 2018    (CN) .......................... 201810457249.3

(51) Int. Cl.
*H01L 51/52*     (2006.01)
*H01L 27/32*     (2006.01)
*H01L 51/56*     (2006.01)

(52) U.S. Cl.
CPC ...... *H01L 51/5246* (2013.01); *H01L 27/3246* (2013.01); *H01L 51/56* (2013.01); *H01L 2227/323* (2013.01); *H01L 2251/5338* (2013.01)

(58) Field of Classification Search
USPC .......................................................... 257/40
See application file for complete search history.

(56) References Cited

U.S. PATENT DOCUMENTS

2014/0131690 A1    5/2014    Kondo et al.
2017/0149014 A1*   5/2017    Choi .................. H01L 51/0097
(Continued)

FOREIGN PATENT DOCUMENTS

CN    103636290 A    3/2014
CN    105226079 A    1/2016
(Continued)

OTHER PUBLICATIONS

Office Action of Chinese Patent Application No. 201810457249.3.
(Continued)

*Primary Examiner* — Nduka E Ojeh
(74) *Attorney, Agent, or Firm* — Kilpatrick Townsend & Stockton

(57) ABSTRACT

The present invention relates to manufacturing methods of display panels. According to an embodiment, a method includes: providing an array substrate, the array substrate defining at least one mounting groove for providing a mounting space for a hardware structure, the mounting groove extending through the array substrate along a thickness direction of the array substrate, forming a package structure on a side of the array substrate for packing the organic light emitting unit. The mounting groove is exposed.

19 Claims, 2 Drawing Sheets

(56) References Cited

U.S. PATENT DOCUMENTS

| | | | | |
|---|---|---|---|---|
| 2017/0308345 | A1* | 10/2017 | He | G06F 1/1647 |
| 2018/0069063 | A1* | 3/2018 | Kim | H01L 27/326 |
| 2018/0277414 | A1 | 9/2018 | Boe et al. | |
| 2019/0035871 | A1 | 1/2019 | Qian et al. | |
| 2019/0148672 | A1* | 5/2019 | Seo | H01L 51/5271 |
| | | | | 257/40 |

FOREIGN PATENT DOCUMENTS

| | | | |
|---|---|---|---|
| CN | 108666353 | A | 10/2016 |
| CN | 106298620 | A | 1/2017 |
| CN | 107393905 | A | 11/2017 |
| CN | 107658332 | A | 2/2018 |
| CN | 207199626 | A | 4/2018 |
| CN | 108428728 | A | 8/2018 |
| JP | 2006040581 | A | 2/2006 |

OTHER PUBLICATIONS

Notice of Allowance of Chinese Patent Application No. 201810457249.3.
International Search Report of International Patent Application No. PCT/CN2018/117516.

* cited by examiner

DISPLAY PANEL WITH SUPPORT STRUCTURE AND METHOD OF MANUFACTURING THE SAME

CROSS REFERENCE TO RELATED APPLICATIONS

This application is a national stage for International Application PCT/CN2018/117516, filed on Nov. 26, 2018, which claims the priority benefit of Chinese Patent Application No. 201810457249.3, titled "DISPLAY PANELS AND METHODS OF MANUFACTURING THEREOF" and filed on May 14, 2018. The entireties of both applications are incorporated by reference herein for all purposes.

TECHNICAL FIELD

The present application relates to the field of display technologies, and more particularly relates to display panels and manufacturing methods thereof.

BACKGROUND

In recent years, with the development of technologies for smart terminal devices and wearable devices, the demand for displays has become more and more diverse. For example, compared with a liquid crystal display, in an organic light emitting diode (OLED) display, a backlight module that consumes more energy is omitted, and the organic light emitting diode display has self-light emitting performance. Thus, it has an advantage of better energy saving. In addition, OLED displays are widely used in smart terminal products such as mobile phones and tablets because of their advantages of bendability, good flexibility or the like compared with conventional panel displays.

Since OLED displays are easy to customize appearances, more and more terminal manufacturers apply them to full screen and frameless products. However, since the full screen and frameless products require a larger light emitting area, it is usually necessary to provide a mounting groove on the organic light emitting diode display to reserve a mounting position of hardware such as a front camera or an earpiece on a terminal device in practical application.

Package methods of the OLED display device mainly include a cover type package and a thin film package. The thin film package realizes package of an OLED device through lamination of an organic thin film layer and an inorganic thin film layer, which is generally used for package of a flexible OLED display device. The cover type package uses high-energy laser to illuminate package materials in a package region after covering a cover glass on the organic light emitting device (OLED), so that the package materials melt and flow to a base substrate after being heated, so as to realize bonding of the cover glass and the base substrate, and then realize the package.

The mounting groove is usually provided by using a cutter wheel or a laser to cut on a display panel after the package is completed. However, whether it is the cutter wheel cutting or the laser cutting process, it is extremely easy to cause damage due to destruction of organic light emitting units at an edge of a grooved region, thus causing abnormal display and poor sensing of the edge of the grooved region.

SUMMARY

According to various embodiments disclosed herein, a display panel and a manufacturing method of the same are provided.

A manufacturing method of a display panel includes:
providing an array substrate, the array substrate defining at least one mounting groove, the mounting groove extending through the array substrate along a thickness direction of the array substrate;
forming an organic light emitting unit on a region of the array substrate except a region of the mounting groove; and
forming a package structure on a side of the array substrate for packaging the organic light emitting unit, the mounting groove being exposed.

According to the manufacturing method of the display panel described above, cutting and grooving is performed before the organic light emitting unit is evaporated on the array substrate, which avoids display defects and sensing defects caused by damage of components at the edge of the mounting groove during the cutting process, thereby improving the yield of the display panel.

In an embodiment, prior to the step of forming an organic light emitting unit on a region of the array substrate except a region of the mounting groove, the method further includes: providing a support structure, supporting the support structure on a side of the array substrate away from the organic light emitting unit, and filling the support structure in the mounting groove.

In an embodiment, the support structure includes a first support portion supporting on the side of the array substrate away from the organic light emitting unit, and a second support portion having an end connected to a side of the first support portion facing to the array substrate, and the second support portion extends into and fills in the mounting groove.

In an embodiment, prior to the step of forming a package structure on a side of the array substrate for packaging the organic light emitting unit, the method further includes: separating the support structure from the array substrate.

In an embodiment, the step of separating the support structure from the array substrate includes:
heating the first support portion and the array substrate to reduce adhesion between the first support portion and the side of the array substrate away from the organic light emitting unit; and separating the first support portion from the array substrate, so as to disengage the second support portion from the mounting groove.

In an embodiment, the method further includes:
providing a carrier substrate;
forming a base substrate on the carrier substrate;
forming a thin film transistor, an anode, and a functional film layer sequentially on the base substrate; and
removing a part of the carrier substrate, a part of the base substrate, and a part of the array substrate within at least one predetermined region so as to form the mounting groove.

In an embodiment, the step of removing a part of the carrier substrate, a part of the base substrate, and a part of the array substrate within at least one predetermined region so as to form the mounting groove includes:
etching through a part of the carrier substrate, a part of the base substrate, and a part of the array substrate located within at least one predetermined region, so as to form the mounting groove.

In an embodiment, the display panel is a flexible display panel, and the step of forming a package structure on a side of the array substrate for packaging the organic light emitting unit includes:
forming a thin film package layer covering the organic light emitting unit on the region of the array substrate except the region of the mounting groove.

In an embodiment, the display panel is a hard display panel, and the step of forming a package structure on a side of the array substrate for packaging the organic light emitting unit includes:

providing a package cover;

disposing a sealant between the package cover and the array substrate, and aligning the package cover with the array substrate to form a sealed package space; and defining at least one through hole extending through the mounting groove in the package cover, the through hole corresponding to the mounting groove.

A display panel includes:

an array substrate including at least one mounting groove, the mounting groove extending through the array substrate in a thickness direction of the array substrate;

an organic light emitting unit disposed on a side of the array substrate except a region of the mounting groove; and In an embodiment, the array substrate includes at least a carrier substrate, a base substrate, a thin film transistor, an anode and a functional film layer stacked sequentially; the functional film layer defines at least a pixel defining layer, and the pixel defining layer includes a plurality of pixel defining openings.

In an embodiment, the organic light emitting unit includes at least an organic light emitting material layer and a cathode layer formed on the organic light emitting material layer, and the organic light emitting unit is correspondingly disposed in the plurality of pixels defining openings.

In an embodiment, the organic light emitting material layer includes a conjugated polymer material.

In an embodiment, the package structure includes a thin film package layer.

In an embodiment, the package structure includes a package cover aligned with the array substrate, the package cover and the package substrate have a sealant disposed therebetween to form a sealed package space, the package cover has at least one through hole corresponding to the mounting groove defined therein.

DETAILED DESCRIPTION OF THE EMBODIMENTS

Figure 1:
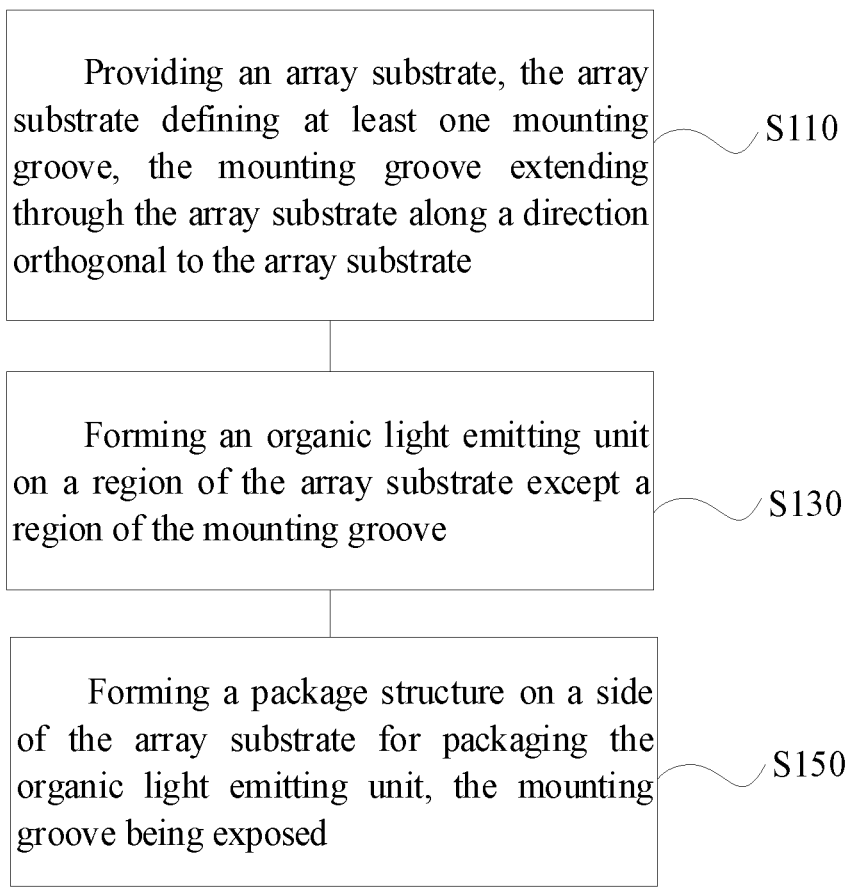
FIG. 1 is a flow chart of a manufacturing method of a display panel according to an embodiment of the present application.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

In a producing and fabricating process of a display panel, in order to reduce a fabricating cost and form a large-scale batch production, generally, a plurality of display panels are manufactured on a large display panel motherboard, and then the display panel motherboard that is relatively larger is cut into several separate display panels through a cutting process. Generally, the display panel motherboard includes a motherboard body and a package structure formed on the motherboard body. The motherboard body has a plurality of display panels, and each of the display panels is provided with an OLED device. The package structure includes a plurality of package structures corresponding to the plurality of display panels one by one, and each package structure is used to package the OLED device in the corresponding display panel.

Under the trend of narrower and narrower frames of the display panel, a distance between a position of a cutting line on the display panel motherboard and a boundary of a display component package is gradually narrowed. In addition, in the actual application process, it is usually required to provide a mounting groove on the display panel to reserve a mounting position of a hardware such as a front camera, an earpiece, a start button, a speaker, or the like on a terminal device. Generally, the mounting groove is provided in a non-display region outside an effective display region. Since an area of the effective display region is limited in this way, an effect of "full screen" or "narrow frame" cannot be achieved, and therefore, it is necessary to provide the mounting groove in the display region.

Taking laser cutting in the grooving process as an example, the principle of the laser cutting is to cut a film layer by thermal melting, and a package structure of a flexible display panel is a thin film package layer formed of an inorganic layer and an organic layer. Since an edge of the thin film package layer may be damaged by expansion or tear due to absorption of a large amount of heat, water vapor may permeate from a side of the display panel, thereby damaging organic light emitting units, so that the display panel cannot achieve long-term excellent display performance. In addition, when the laser cutting is used, high-energy laser irradiation generates high heat, so that an instantaneous temperature may reach 800° C.~1000° C., and static electricity is generated. This may cause damage to an organic layer, a functional layer, a metal cathode, or the like in the organic light-emitting unit.

Taking the cutter wheel cutting in the grooving process as an example, pressing and edging of the cutter wheel may easily cause an internal stress release of a sealant, which may cause the sealant to crack, and may even cause a package cover plate and a substrate to peel off, causing water and oxygen to enter an organic light emitting unit through a cracking channel, and resulting in black spots and bubbles in the organic light emitting unit, which eventually leads to a device failure. In addition, during cutting of the cutter wheel, since an amount of grinding edge of the cutter wheel is limited, cutting deviation or miscutting is likely to occur, thereby resulting in poor display and poor sensing at an edge of the mounting groove.

Therefore, it is necessary to provide a display panel capable of avoiding display abnormality and poor sensing caused during a grooving process of the display panel and a manufacturing method thereof.

It can be understood that the display panel provided by the embodiments of the present application is mainly applied to a full-screen or a frameless display panel, and may also be applied to a display panel having a normal frame or a narrow frame.

Figure 2:
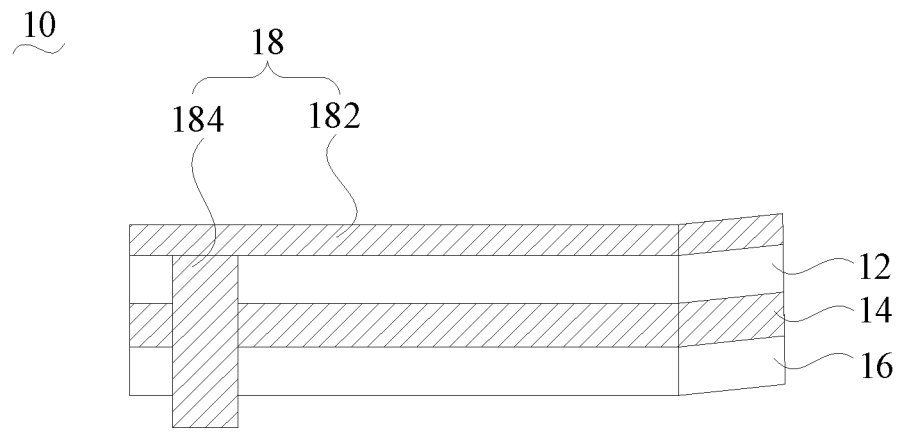
FIG. 2 is a cross-sectional view of a display panel according to an embodiment when an organic light emitting unit is not formed.
Figure 3:
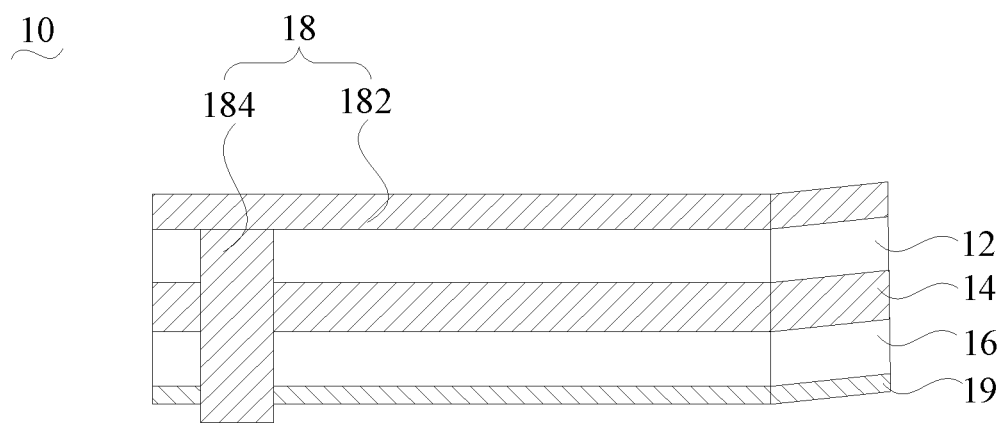
FIG. 3 is a cross-sectional view of the display panel shown in FIG. 2 when the organic light emitting unit is formed.

FIG. 1 is a flow chart illustrating a manufacturing method of a display panel according to an embodiment of the present application. FIG. 2 is a cross-sectional view illustrating a display panel according to an embodiment of the present application when an organic light emitting unit is not formed. FIG. 3 is a cross-sectional view illustrating the display panel shown in FIG. 2 when the organic light emitting unit is formed. For the convenience of description, only the structure of the portion related to the embodiment of the present application is shown in the above drawings.

Referring to FIG. 1, a manufacturing method of a display panel is provided according to an embodiment of the present application, which includes the following steps.

In step S110, an array substrate is provided.

Referring to FIG. 2, the array substrate 10 defines at least one mounting groove (not shown) used to provide a mounting space for a hardware structure. The mounting groove extends through the array substrate 10 in a thickness direction of the array substrate 10.

The array substrate, i.e., a thin-film transistor (TFT) array substrate, refers to a carrier substrate (for example, a glass substrate) having at least a base substrate, a TFT array, an anode, and a functional film layer such as a pixel defining layer are formed thereon.

The mounting groove is a region for mounting the hardware structure. For convenience of description, it is referred as a mounting groove in the present application, but its name is not limited thereto, and therefore it can be modified to other names as needed, for example, a through hole, a groove, a mounting hole, or the like. In an embodiment, the hardware structure includes one or more chosen from the following structures: a front camera, a start button, an earpiece, or a speaker. A specific mounting method of the hardware structure is not limited herein. In addition, when forming the mounting groove, shape of the cut mounting groove is determined according to the hardware structure to be mounted, and different shapes of mounting grooves may be provided for different hardware structures. In an embodiment, cross-sectional shape of the mounting groove in a direction parallel to the base substrate is one or more chosen from the following shapes: circular, elliptical, rectangular, trapezoidal, diamond, or square.

Taking the flexible display panel as an example, the array substrate 10 includes a carrier substrate 12, a base substrate 14 (for example, made of PI material) formed on the carrier substrate 12, a thin film transistor 16 disposed on the base substrate 14, and an anode and a functional film layer (not shown) disposed on the thin film transistor 16. The functional film layer includes at least a pixel defining layer, and the pixel defining layer defines a plurality of pixel defining openings (not shown) for accommodating the organic light emitting units.

In step S130, an organic light emitting unit is formed on a region of the array substrate 10 except a region of the mounting groove.

Referring to FIG. 3, the organic light emitting unit 19 includes at least an organic light emitting material layer and a cathode layer formed on the organic light emitting material layer. In some embodiments, the organic light emitting material layer can have a multilayer structure, for example, not only includes the light emitting layer, but also includes an electron transport layer and a hole transport layer for balancing electrons and holes, and an electron injection layer and a hole injection layer for enhancing injection of electrons and holes d.

The array substrate 10 has a plurality of pixel regions, each of the pixel regions can include a plurality of sub-pixel regions. For example, in some embodiments, one pixel region includes a sub-pixel region that emits red light, a sub-pixel region that emits green light, and a sub-pixel region that emits blue light. The organic light emitting unit 19 is a pixel including a plurality of sub-pixels. In manufacturing, light emitting layers emitting red, green and blue light can be evaporated onto the corresponding sub-pixel regions via a precision metal mask.

Specifically, in some embodiments, the pixel defining layer defines a plurality of pixel defining openings, and each pixel defining opening is used to define a corresponding pixel. The pixel defining opening includes a plurality of sub-openings, and the corresponding sub-pixels are disposed in the corresponding sub-openings. In manufacturing, the organic light emitting unit 19 is formed by performing evaporation at the pixel defining openings, and the organic light emitting material is not evaporated in the grooved region.

In step S150, a package structure is formed on a side of the array substrate for packaging the organic light emitting unit, and the mounting groove is exposed.

The package structure is formed on a side of the array substrate 10 on which the organic light emitting unit 19 is formed, and the package structure can block the air and moisture from the organic light emitting unit 19. It is easy to understand that since the organic light emitting material is very sensitive to an external environment such as moisture and oxygen, if the organic light emitting material in the display panel is exposed in an environment in which moisture or oxygen is present, the performance of the display panel may be rapidly reduced or the display panel may be completely damaged. Through providing a package structure on the array substrate 10, the organic light emitting unit 19 can be well protected, thereby improving the reliability of the display panel.

According to the manufacturing method of the display panel provided by the embodiment of the present invention, cutting and grooving is performed before the organic light emitting unit 19 is evaporated on the array substrate 10, so as to avoid damage to the organic light emitting unit 19 during the cutting process, thereby improving the production yield of the display panel. In addition, the evaporation and package of the organic unit are performed after cutting and grooving, so that the package structure is prevented from being damaged such as being expanded or teared due to a large amount of heat absorbed by the edges of the package structure in the subsequent cutting process. Thus, the organic light emitting unit 19 is prevented from being eroded by air or water vapor outside the closed space, thereby improving the display effect and the service life of the display panel.

In some embodiments of the present application, prior to step S130, the method further includes the following step.

In step S120, a support structure is provided; the supporting structure is supported on a side of the array substrate away from the organic light emitting unit, and is filled in the mounting groove.

In some embodiments, the support structure 18 includes a first support portion 182 supporting on the side of the array substrate 10 away from the organic light emitting unit 19, and a second support portion 184 having an end connected to a side of the first support portion 182 facing to the array substrate 10. The second support portion 184 extends into and is filled in the mounting groove. In this way, the array substrate 10 having the mounting groove can be well supported, thereby improving the strength of the array substrate 10, thereby ensuring the yield of the display panel. It is easy to understand that because in the process of evaporating the organic light emitting unit, the thin film transistor 16, the anode layer, and the functional film layer are located on the side of the carrier substrate 12 away from the first support portion 182, therefore the first support portion 182 can play a role of limiting and fixing to avoid the second support portion 184 from being displaced or even falling off in the mounting groove, so as to ensure the relative fixing of the support structure 18 and the array substrate 10.

Specifically, in this embodiment, the first support portion 182 is of a plate shape and abuts on a side of the carrier substrate 12 away from the base substrate 14. The shape of the second support portion 184 matches the shape and size of the mounting groove. The second support portion 184 extends from the side of the array substrate 10 away from the organic light emitting unit 19 and is filled in the mounting groove.

An extending length of the second support portion 184 in the vertical direction (the vertical up-down direction in FIG. 2) can be equal to or unequal to a depth of the mounting groove, but should be at least flush with a surface of the array substrate 10 on which the organic light emitting unit 19 is disposed, thereby supporting the mounting groove and facilitating evaporation formation of the organic light emitting unit. In an embodiment, an end of the second support portion 184 away from the first support portion 182 protrudes from a side of the array substrate 10 on which the organic light emitting unit is disposed. In this way, in the evaporation process of the organic light emitting unit, the organic light emitting unit can be evaporated along periphery of the second support portion 184, thereby avoiding occurrence of poor evaporation of the organic light emitting unit at an edge of the mounting groove.

The second support portion 184 can be fixedly connected to the first support portion 182 or can be detachably connected to the first support portion 182. For example, in some embodiments, the second support portion 184 can be bonded to the first support portion 182 by an adhesive. In other embodiments, the second support portion 184 can also be integrally formed with the first support portion 182, which is not limited herein.

Since the second support portion 184 is filled in the mounting groove, the organic light emitting unit 19 can be evaporated along the periphery of the second support portion 184 during the evaporation of the organic light emitting unit 19, thereby avoiding the occurrence of poor evaporation of the organic light emitting unit at the edge of the mounting groove. In addition, during the manufacturing process of the display panel, the support structure 18 supports the side of the array substrate 10 away from the organic light emitting unit 19 and the circumference of the mounting groove, so as to ensure the strength of the display panel, thereby improving the reliability of the display panel.

Further, the first support portion 182 is provided to support on the side of the array substrate 10 away from the organic light emitting unit 19 and the second support portion 184 extends into and is filled in the mounting groove before forming the organic light emitting unit, influence to film layers on the edge of the mounting groove in the subsequent process can be prevented, thereby improving the yield of the display panel.

In some embodiments of the present application, prior to step S150, the method further includes the following steps.

In step S140, the support structure 18 is separated from the array substrate 10.

After the evaporation of the organic light emitting unit 19 is completed, the support structure 18 can be separated from the array substrate 10 through mechanical peeling. In a specific implementation, the first support portion 182 and the second support portion 184 can be separated from the array substrate 10 together, or the first support portion 182 and the second support portion 184 can be separated from the array substrate 10 separately.

In some embodiments, if the first support portion 182 is fixedly connected to the second support portion 184, the first support portion 182 is separated from the side of the carrier substrate 12 away from the base substrate 12, and the second support portion 184 can be taken out from the mounting groove consequently. In other embodiments, if the first support portion 182 is detachably connected to the second support portion 184, for example, the first support portion 182 and the second support portion 184 are bonded together by glue, then adhesiveness between the first support portion 182 and the second support portion 184 is reduced by heating when separating, so that the first support portion 182 and the second support portion 184 can be separated from each other, and then the first support portion 182 and the second support portion 184 can be separated from the array substrate 10 respectively. Thus, damage that may be caused to the array substrate 10 when the support structure 18 is separated from the array substrate 10 is reduced.

When separating the first support portion 182 from the second support portion 184, at least the second support portion 184 is required to be separated from the array substrate 10. In an embodiment, after the organic light emitting unit 19 is formed by evaporation, the second support portion 184 can be individually separated from the mounting groove, and after the manufacturing process of the display panel is completed, the first support portion 182 is further peeled off the carrier substrate 12. Thus, the first support portion 182 can continue to support the array substrate 10 in the subsequent process, thereby improving the strength of the display panel.

The organic light emitting material is a conjugated polymer material. The conjugated polymer material has high elasticity, and has little influence on structure of the organic light emitting unit 19 during the process of removing the support structure. Further, after the evaporation is completed, the support structure can be separated in a mechanical way. For example, the support structure is pre-separated from the organic light emitting material through a blade firstly, and then an external force is applied so as to completely separate the support structure from the organic light emitting material. In this way, damage to the organic light emitting unit 19 can be more effectively reduced.

In some embodiments of the present application, the first support portion 182 is supported (e.g., be bonded) on a side of the array substrate away from the organic light emitting unit 19. Specifically, an adhesive can be applied on a corresponding region on the side of the carrier substrate 12 away from the base substrate 14, and then the second support portion 184 is placed in the mounting groove, and the first support portion 182 is bonded to the carrier substrate 12 by adhesive. In this way, the support structure 18 can be fixed, thereby preventing the support structure 18 from being displaced with respect to the array substrate 10, and further ensuring the support of the array substrate 10 by the support structure 18, so as to improve the reliability of the display panel.

Of course, in other embodiments, the adhesive can be applied to the first support portion 182, which is not limited herein.

In some embodiments of the present application, separating the support structure 18 from the array substrate 10 specifically includes the following steps.

In step S132, the first support portion 182 and the array substrate 10 are heated to reduce adhesion between the first support portion 182 and the side of the array substrate 10 away from the organic light emitting unit 19.

Specifically, when degree of the adhesion of the adhesive between the first support portion 182 and the array substrate 10 decreases after heating, the first support portion 182 can be separated from the side of the carrier substrate 12 away from the base substrate 14 by mechanical peeling.

In step S134, the first support portion 182 is separated from the array substrate 10, and the second support portion 184 is disengaged from the mounting groove.

Since the second support portion 184 is connected to the first support portion 182, the second support portion 184 can be simultaneously separated from the mounting groove during the process of separating the first support portion 182 from the array substrate 10.

In this way, the support structure 18 can be fixed by the adhesive, and by heating the first support portion 182 and the array substrate 10, the adhesion between the two can be reduced, thereby enabling the support structure 18 separable from the array substrate 10. Thus, while preventing displacement of the support structure 18 with respect to the array substrate 10, separation process is simplified, control thereof is facilitated, and the yield of manufacturing the display panel is improved.

In some embodiments of the present application, the display panel is a flexible display panel, and step S130 specifically includes the following steps.

A thin film package layer covering the organic light emitting unit 19 is formed on the region of the array substrate 10 except the region of the mounting groove.

In a specific implementation, a thin film package material can be used to form the thin film package layer on the array substrate 10 on which the organic light emitting unit 19 is evaporated, but the grooved region is not packaged. The thin film package layer covers the organic light emitting unit 19 to achieve the package of the organic light emitting unit 19.

The thin film package layer can be a structure with one or more layers, and can be an organic film layer or an inorganic film layer, or can be a laminated structure of an organic film layer and an inorganic film layer. For example, in an embodiment, the thin film package layer can include two inorganic film layers and one organic film layer between the two inorganic film layers.

In other embodiments, the display panel is a hard screen display panel, and step S130 specifically includes the following steps.

A package cover is provided.

A sealant is disposed between the package cover and the array substrate 10, and the package cover is aligned with the array substrate 10 to form a sealed package space.

A sealant pattern can be printed on the package region of the array substrate 10, and then the package cover is aligned with the array substrate 10 so that through holes on the package cover correspond to the mounting grooves. Then, the sealant pattern is scanned by laser to melt the sealant and package the package cover and the array substrate 10 together so as to form the sealed package space, thereby protecting the organic light emitting unit 19. It can be understood that, in other embodiments, the sealant pattern can be printed on the package region of the package cover, and then aligning and laser scanning melting can be performed as long as the purpose of bonding the package cover to the array substrate 10 can be achieved.

The through holes communicating with the mounting grooves are provided on the package cover, and the through holes correspond to the mounting groove one by one.

The through holes corresponding to the mounting groove can be cut on the package cover by a laser or a cutter wheel to expose the mounting groove. It can be understood that, in some embodiments, the through holes corresponding to the mounting groove can be provided in the package cover before aligning the cover plate with the array substrate 10, which is not limited herein.

In some embodiments of the present application, the method further includes the following steps.

In step S112, the carrier substrate 12 is provided.

Specifically, the carrier substrate 12 can be a glass substrate.

In step S114, the base substrate 14 is formed on the carrier substrate 12.

Taking the flexible display panel as an example, the base substrate 14 is formed on the carrier substrate 12. The base substrate 14 is a flexible substrate, which is optionally formed of an organic polymer, silicon nitride, and silicon oxide. The organic polymer can, for example, be one chosen from a polyimide substrate, a polyamide substrate, a polycarbonate substrate, a polyphenylene ether sulfone substrate, or the like. In some embodiments, the base substrate 14 can be obtained by curing the polyimide after coating the polyimide glue on the carrier substrate 12.

In step S116, the thin film transistor 16, the anode, and the functional film layer are sequentially formed on the base substrate 14.

The thin film transistor 16 is formed on the base substrate 14. In some embodiments, an additional layer such as a buffer layer can be formed on the base substrate 14 prior to forming the thin film transistor 16. The buffer layer can be formed on an entire surface of the base substrate 14, or can be formed by patterning.

The buffer layer can have a suitable material including a material such as PET, PEN polyacrylate, and/or polyimide to form a layered structure in a form of a single layer or a multilayer stack. The buffer layer can also be formed of silicon oxide or silicon nitride, or can include a composite layer of an organic material layer and/or an inorganic material.

The thin film transistor 16 can control emission of each sub-pixel or can control an amount of the emission when each sub-pixel emits. The thin film transistor 16 can include a semiconductor layer, a gate electrode, a source electrode, and a drain electrode. The semiconductor layer can be formed of an amorphous silicon layer, a metal oxide, or a polysilicon layer, or can be formed of an organic semiconductor material. In some embodiments, the semiconductor layer includes a channel region and a source and drain region doped with dopants.

The semiconductor layer can be covered with a gate insulating layer, and the gate electrode can be disposed on the gate insulating layer. In general, the gate insulating layer can cover the entire surface of the base substrate 14. In some embodiments, the gate insulating layer can be formed by patterning. The gate insulating layer can be formed of silicon oxide, silicon nitride, or other insulating organic or inorganic material in consideration of adhesion to an adjacent layer, formability and surface flatness of a stacked target layer. The gate electrode can be covered by an interlayer insulating layer formed of silicon oxide, silicon nitride, and/or other suitable insulating organic or inorganic materials. A portion of the gate insulating layer and the interlayer insulating layer can be removed, and a contact hole is formed after the removal so as to expose a predetermined region of the semiconductor layer. The source electrode and the drain electrode can contact the semiconductor layer via the contact hole.

Since the thin film transistor 16 has a complicated layer structure, a top surface thereof may be uneven. In some embodiments, the thin film transistor 16 also includes a planarization layer to form the top surface that is sufficiently even. After the planarization layer is formed, through holes can be formed in the planarization layer to expose the source electrode and the drain electrode of the thin film transistor 16.

In some embodiments, the functional film layer includes a pixel defining layer. The anode is a pixel electrode. The pixel electrode includes sub-pixel electrodes corresponding to the sub-pixel regions, and the plurality of sub-pixel electrodes are formed on the planarization layer. It is easy to understand that a plurality of sub-pixel electrodes are electrically connected to the thin film transistor 16 through the aforementioned through holes, and the sub-pixel electrodes are generally referred to as anodes herein. The pixel defining layer covers a plurality of sub-pixel electrodes and the pixel defining layer has corresponding sub-pixel openings for defining the sub-pixels. For example, the pixel defining layer can be formed of a suitable organic material such as polyacrylate, polyimide, or the like, or a single material layer including a suitable inorganic material, or composite material layer. Specifically, in an embodiment, the pixel defining layer can expose a central portion of each of the sub-pixel electrodes by a patterning process.

In step S118, a part of the carrier substrate 12, a part of the base substrate 14, and a part of the array substrate 10 within least one predetermined region are removed so as to form the mounting groove.

For example, the predetermined region can be selected firstly. Shape of the predetermined region is same to the shape of the mounting groove, and a graphic size of the predetermined region is consistent with a graphic size of the mounting groove. Then, the carrier substrate 12, the base substrate 14, and the respective film layers are cut along a boundary line of the predetermined region, thereby forming the aforementioned mounting groove.

The carrier substrate 12, the base substrate 14, and the film layers of the predetermined region can be cut off by a cutter wheel cutting process or a laser cutting process. Of course, in other embodiments, other processes can be used. For example, in other embodiments, removing a part of the carrier substrate, a part of the base substrate, and a part of the array substrate within at least one of predetermined regions so as to form the mounting groove specifically includes the following step.

A part of the carrier substrate, a part of the base substrate, and a part of the array substrate located within at least one of the predetermined regions are removed by etching, so as to form the mounting groove.

Thus, by using the etching process, the damage to the organic light emitting unit 19 during the cutting process can be further reduced, and the yield of the display panel is further improved.

Based on the afore-described manufacturing method of the display panel, the present application further provides a display panel formed by the manufacturing method of the display panel in the above embodiments.

The display panel includes an array substrate 10, an organic light emitting unit 19 formed on the array substrate 10, and a package structure for packaging the organic light emitting unit 19. The display panel also includes at least one mounting groove for providing mounting space for a hardware structure. The mounting groove extends through the display panel in a thickness direction of the array substrate 10.

It should be noted that the display panel can be a panel after the carrier substrate 12 is peeled off, or can be a panel that retains the carrier substrate 12.

Based on the afore-described display panel, an embodiment of the present application further provides a display device. In some embodiments, the display device can be a display terminal, such as a tablet computer, and in other embodiments, the display device can also be a mobile communication terminal, such as a mobile phone terminal.

In some embodiments, the display device includes a display panel and a control unit used to transmit a display signal to the display panel. In summary, according to the manufacturing method of the display panel provided by the embodiments of the present invention, the cutting and grooving is performed before the organic light emitting unit 19 is evaporated on the array substrate 10, so as to avoid damage to the organic light emitting unit 19 during the cutting process, thereby improving the production yield of the display panel. In addition, the evaporation and package of the organic unit are performed after cutting and grooving, so that the package structure is avoid from being damaged such as being expanded or teared due to a large amount of heat absorbed by the edges of the package structure in the subsequent cutting process. Thus, the organic light emitting unit 19 is prevented from being eroded by air or water vapor outside the closed space, thereby improving the display effect and the service life of the display panel.

At the same time, since the second support portion 184 is filled in the mounting groove, the organic light emitting unit 19 can be evaporated along the periphery of the second support portion 184 during the evaporation of the organic light emitting unit 19, thereby avoiding poor evaporation of the organic light emitting unit at the edge of the mounting groove. In addition, during the manufacturing process of the display panel, the support structure 18 supports the side of the array substrate 10 away from the organic light emitting unit 19 and the circumference of the mounting groove, so as to ensure the strength of the display panel, thereby improving the reliability of the display panel.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A method of manufacturing a display panel, comprising:
providing an array substrate, the array substrate defining at least one mounting groove, the mounting groove extending through the array substrate along a thickness direction of the array substrate;
providing a support structure, supporting the support structure on a side of the array substrate away from an organic light emitting unit, and filling the support structure in the mounting groove;

forming the organic light emitting unit on a region of the array substrate except a region of the mounting groove; and forming a package structure on a side of the array substrate for packaging the organic light emitting unit, the mounting groove being exposed.

2. The method of claim 1, wherein the support structure comprises a first support portion supporting on the side of the array substrate away from the organic light emitting unit, and a second support portion having an end connected to a side of the first support portion facing to the array substrate, and the second support portion extends into and fills the mounting groove.

3. The method of claim 2, wherein prior to the step of forming a package structure on a side of the array substrate for packaging the organic light emitting unit, the method further comprises:

separating the support structure from the array substrate.

4. The method of claim 3, wherein the step of separating the support structure from the array substrate comprises:

heating the first support portion and the array substrate to reduce adhesion between the first support portion and the side of the array substrate away from the organic light emitting unit; and separating the first support portion from the array substrate, so as to disengage the second support portion from the mounting groove.

5. The method of claim 1, further comprising:
providing a carrier substrate;
forming a base substrate on the carrier substrate;
forming a thin film transistor, an anode, and a functional film layer sequentially on the base substrate; and
removing a part of the carrier substrate, a part of the base substrate, and a part of the array substrate within at least one predetermined region so as to form the mounting groove.

6. The method of claim 5, wherein the step of the removing a part of the carrier substrate, a part of the base substrate, and a part of the array substrate within at least one predetermined region so as to form the mounting groove, comprises:

etching through a part of the carrier substrate, a part of the base substrate, and a part of the array substrate within at least one predetermined region, so as to form the mounting groove.

7. The method of claim 1, wherein the display panel is a flexible display panel, and the step of forming a package structure on a side of the array substrate for packaging the organic light emitting unit comprises:

forming a thin film package layer covering the organic light emitting unit on the region of the array substrate except the region of the mounting groove.

8. The method of claim 1, wherein the display panel is a hard display panel, and the step of forming a package structure on a side of the array substrate for packaging the organic light emitting unit comprises:

providing a package cover;
disposing a sealant between the package cover and the array substrate, and aligning the package cover with the array substrate to form a sealed package space; and
defining at least one through hole extending through the mounting groove in the package cover, the through hole corresponding to the mounting groove.

9. A display panel, comprising:
an array substrate comprising at least one mounting groove, the mounting groove extending through the array substrate in a thickness direction of the array substrate;
an organic light emitting unit disposed on a side of the array substrate except a region of the mounting groove; and
a package structure disposed on a side of the array substrate except the region of the mounting groove for packaging the organic light emitting unit;
wherein at least one support portion of a support structure is in the mounting groove during manufacturing process such that the organic light emitting unit is formed through evaporation along a periphery of the at least one support portion of the support structure; and the support structure comprises a first support portion supporting on the side of the array substrate away from the organic light emitting unit, and a second support portion having an end connected to a side of the first support portion facing to the array substrate, and the second support portion extends into and fills the mounting groove.

10. The display panel of claim 9, wherein the array substrate comprises at least a carrier substrate, a base substrate, a thin film transistor, an anode and a functional film layer stacked sequentially; the functional film layer comprises at least a pixel defining layer, and the pixel defining layer defines a plurality of pixel defining openings.

11. The display panel of claim 10, wherein the organic light emitting unit comprises at least an organic light emitting material layer and a cathode layer formed on the organic light emitting material layer, and the organic light emitting unit is correspondingly disposed in the plurality of pixels defining openings.

12. The display panel of claim 11, wherein the organic light emitting material layer comprises a conjugated polymer material.

13. The display panel of claim 9, wherein the package structure comprises a thin film package layer.

14. The display panel of claim 9, wherein the package structure comprises a package cover aligned with the array substrate, the package cover and the array substrate has a sealant disposed therebetween to form a sealed package space, the package cover has at least one through hole corresponding to the mounting groove defined therein.

15. A display panel, comprising:
an array substrate comprising at least one mounting groove, the mounting groove extending through the array substrate in a thickness direction of the array substrate;
an organic light emitting unit disposed on a side of the array substrate except a region of the mounting groove;
a support structure positioned on a side of the array substrate away from the organic light emitting unit, the support structure extending into the mounting groove; and
a package structure disposed on a side of the array substrate except the region of the mounting groove for packaging the organic light emitting unit.

16. The display panel of claim 15, wherein the support structure comprises a first support portion supporting on the side of the array substrate away from the organic light emitting unit, and a second support portion having an end connected to a side of the first support portion facing to the array substrate, and the second support portion extends into and fills the mounting groove.

17. The display panel of claim 16, wherein the first support portion is fixedly connected to the second support portion.

18. The display panel of claim 16, wherein the first support portion is detachably connected to the second support portion.

19. The display panel of claim 16, wherein the first support portion and the second support portion are bonded together using an adhesive.

* * * * *